United States Patent [19]

Linde et al.

[11] Patent Number: 4,590,258

[45] Date of Patent: May 20, 1986

[54] POLYAMIC ACID COPOLYMER SYSTEM FOR IMPROVED SEMICONDUCTOR MANUFACTURING

[75] Inventors: Harold G. Linde, Richmond; Michael W. MacIntyre; William T. Motsiff, both of Essex Junction, all of Vt.

[73] Assignee: International Business Machines Corporation, Armonk, N.Y.

[21] Appl. No.: 566,933

[22] Filed: Dec. 30, 1983

[51] Int. Cl.$^4$ ............................................. C08G 73/10
[52] U.S. Cl. ....................................... 528/189; 528/188
[58] Field of Search ................................ 528/188, 189

[56] References Cited

U.S. PATENT DOCUMENTS 4,048,142  9/1977  Takekoshi ............................ 528/188
4,454,276  6/1984  Uda et al. ............................ 528/188

Primary Examiner—Lester L. Lee
Attorney, Agent, or Firm—Sughrue, Mion, Zinn, Macpeak, and Seas

[57] ABSTRACT

A polyamic acid copolymer forming a polyimide comprising, in mole percent, from greater than 5 percent to about 45 percent pyromellitic dianhydride, from about 5 percent to about 45 percent oxydiphthalic dianhydride, and about 50 percent of oxydianiline. Polyimides formed by curing the copolymer are also disclosed as is a process for forming a heat sealable coating on or dielectric isolation layer within electronic circuitry using the copolymer.

10 Claims, 1 Drawing Figure

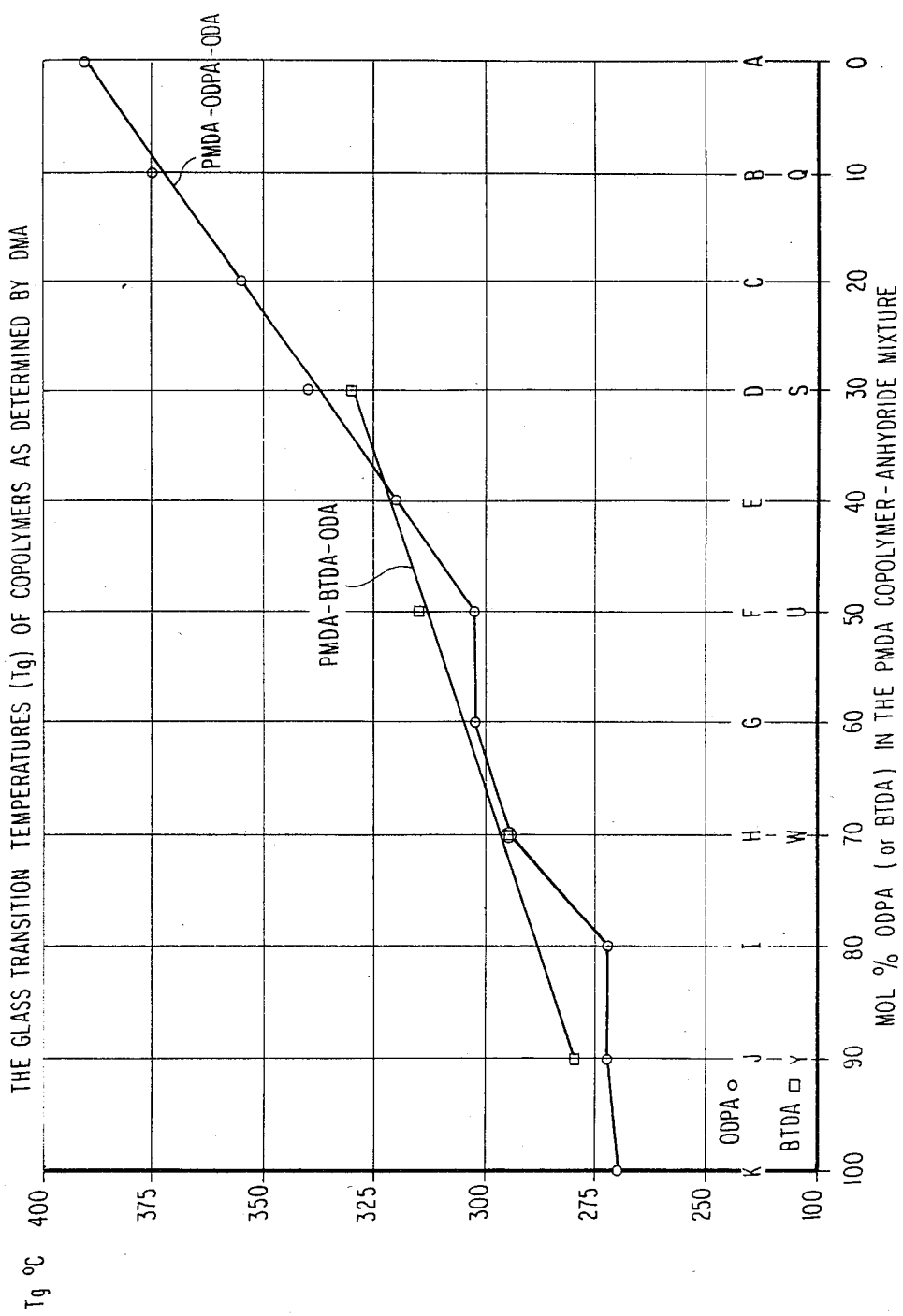

POLYAMIC ACID COPOLYMER SYSTEM FOR IMPROVED SEMICONDUCTOR MANUFACTURING

BACKGROUND OF THE INVENTION

1. Field of the Invention

The present invention relates to polyamic acid copolymer systems which yield a polyimide upon curing and which find particular application in semiconductor manufacturing.

2. Background to the Invention

Typical prior art dealing with overcoating or packaging of electronic devices includes IBM Technical Disclosure Bulletin 16, 728(1973) Cook et al and U.S. Pat. No. 4,001,870 Saiki et al, both hereby incorporated by reference.

U.S. Pat. No. 4,182,853 Kruh discloses polyamideimide materials containing at least one tricarboxylic monoanhydride, a material alien to the present invention. Polyamideimides are prepared via a polyamideimide polyamine intermediate and a tetracarboxylic dianhydride, forming a copolymer.

U.S. Pat. No. 3,640,969 Suzuki et al discloses the preparation of a soluble polyimide resin and processing without preparing a polyamic acid precursor. While this patent does note the storage problem due to the instability of polyamic acids, the copolymer produced by the disclosed method is mainly mellophanic dianhydride (50-85%), a material alien to the present invention. An imidization agent is also used in this process.

U.S. Pat. No. 3,983,093 Williams et al discloses polyetherimides derived from an organic diamine, a bisphenol dianhydride and pyromellitic anhydride. The recited bisphenol dianhydrides do not include oxydiphthalic dianhydrides and, in fact, always contain two or more anhydride-ether linkages, not one as in oxydiphthalic dianhydride.

U.S. Pat. No. 3,832,330 Dixon et al discloses anhydride and urethane or urea derivatives of aromatic diamines and prepolymers obtained as intermediates for preparing polyimides. Dianhydrides and urea derivatives (or urethanes) are melted to form a prepolymer at 180°-200° C. with urethanes or at 120° C. with ureas, eliminating $CO_2$ and producing an alcohol.

U.S. Pat. No. 4,073,788 Peterson discloses a process for producing polyamic acid polymers via novel intermediate reaction products utilizing an imidized polymer to control viscosity of a polyamic acid-imide at the time of application. Stable precursor oligomers are described which continue to polymerize or "zip up" when the stoichiometry of the oligomer is balanced. The precursor oligomers are preimidized by heating the oligomer solution and subsequent addition of unimidized precursors or mixed copolymer precursors is described. If desired, an amine can be added to the prepolymer oligomer to form an ammonium polyamate salt or polyimide salt which is a water soluble prepolymer that can be used as an aqueous-organic solvent coating medium.

U.S. Pat. No. 4,214,071 Alvino et al discloses amide-imide polymers formed from novel amines which contain at least one amide linkage. Mention is made of polyamic acid viscosity stability and oxydiphthalic dianhydride is mentioned. Solutions of the prepared amide-imide polymers are stated to be "stable" for long periods. It is preferred that the novel amines be prepared through reduction of a nitroimide precursor derived from a nitroaniline and an aromatic acylanhydride. A film of the disclosed polymers will adhere to cured Kapton when cured at 250° C. and then laminated at 275° C. at 250 psi for 15 minutes.

U.S. Pat. No. 4,220,750 Reinhardt et al discloses polyimide thermoplastics with enyne functionality that provide cross-linking for reinforced structural composites. The materials are described as having the advantage of a low Tg which increases on thermal processing; control of Tg by copolymerization and variation of Tg on thermal cycling is disclosed.

U.S. Pat. No. 4,269,968 Duran et al discloses a method of polyamic acid synthesis using compacted dianhydride materials.

U.S. Pat. No. 4,302,575 Takekoshi discloses polyetheramide acids and polyetherimides having terminal aliphatic unsaturated groups which are heat curable; these materials are derived from bis(etheranhydrides) and diamines, aliphatic unsaturated dianhydrides being used as end caps. Such materials are stated to have improved processability in the temperature range of 150°-190° C.

U.S. Pat. Nos. 3,179,634 Edwards and 3,264,250 Gall both assigned to Dupont disclose polyimides including pyromellitic dianhydride-benzophenone tetracarboxylic acid dianhydride-oxydianiline copolymers.

In the following discussion, the following abbreviations are often used:

Tg is glass transition temperature.
PMDA is pyromellitic dianhydride.
ODPA is oxydiphthalic dianhydride.
ODA is oxydianiline.

It is known that polyimides formed by reacting PMDA and ODA to polyamic acid and then thermally curing the same to yield the desired polyimide can be used as a passivation dielectric on, e.g., SAMOS devices. See, for example, IBM J. of Research and Development 24, 268-282(1980). The copolymer systems of the present invention could be used in the devices disclosed in these two publications and also in combination with conventional metallized ceramic substrates.

Polyimides of the above type are characterized by good dielectric properties, thermal stability and improved strength on heating. However, such polyimides show a poor ability to adhere to themselves or to metallized surfaces.

Another problem with such polyimides is that they exhibit unstable viscosity characteristics in the form of a polyamic acid solution, complicating application to desired electronic device surfaces, e.g., wafer surfaces.

Further, a thermally cured PMDA-ODA polymer does not have a well defined Tg.

SUMMARY OF THE INVENTION

The present invention provides a copolymer of polyamic acids forming a polyimide having a glass transition temperature of from about 375° C. to 270° C. comprising, in mole percent, from greater than 5% to about 45% pyromellitic dianhydride, from about 5% to about 45% oxydiphthalic dianhydride and about 50% of oxydianiline.

The copolymers of the present invention contain 10 to 90% recurring units of formula A as set forth below and 90 to 10% recurring units of formula B as set forth below:

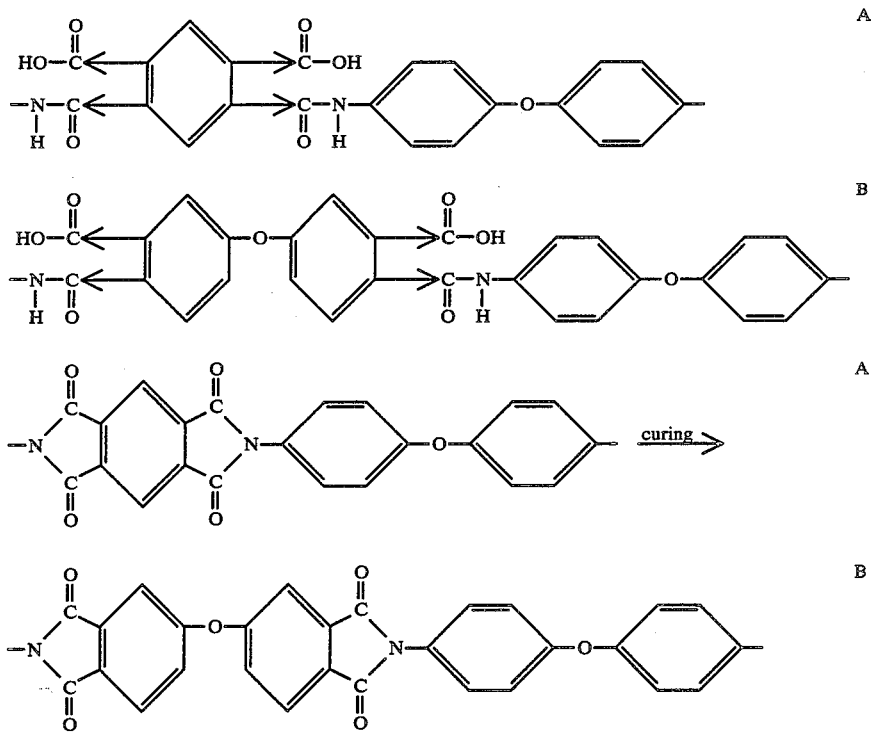

The present invention provides polyamic acid copolymers which can be cured to yield a desired polyimide combining the benefits of non-rigid ODPA-ODA molecular flexibility, which possesses a well defined Tg, with the semi-rigid molecular structure of the PMDA-ODA system, which possesses excellent thermal stability, yielding a thermally stable polyimide copolymer with a reproducible Tg in the temperature range of final semiconductor manufacturing steps, e.g., on the order of 350° C.

One object of the present invention is to provide polyamic acid copolymers which form a polyimide whose glass transition temperature can be easily varied in a controlled manner by varying the proportions of the components thereof.

Another object of the present invention is to provide an improved polyimide passivation dielectric which exhibits excellent electrical and thermal stability in combination with improved processibility, reliability and adhesion.

A further object of the present invention is to provide a thermally stable polyimide which shows improved interpenetration at an interface with another polyimide layer, minimizing interfacial boundaries and eliminating interfacial stresses and defects.

A further object of the present invention is to provide polyamic acid copolymer solutions of improved viscosity stability.

BRIEF DESCRIPTION OF THE DRAWING

The FIGURE is a plot of Tg (°C.) vs. % ODPA and % PMDA in various ODA polyimides and includes, for comparison purposes, a plot of Tg (°C.) versus % BTDA for a series of random copolymers prepared from PMDA, benzophenonetetracarboxylic acid dianhydride (BTDA) and ODA.

DESCRIPTION OF PREFERRED EMBODIMENTS

The present invention thus provides a family of polyamic acid copolymers/polyimide copolymers which can be tailored to specific semiconductor applications.

This family of polyamic acid copolymers/polyimide copolymers is characterized by a well defined, and reproducibly adjustable Tg which results from copolymerization of a precursor polyamic acid forming anhydride which imparts a well defined polyimide Tg with one which does not. For example, as indicated, a thermally cured PMDA-ODA copolymer does not have a well defined Tg while an ODPA-ODA polyimide polymer has a Tg of about 270° C. Thus, copolymer polyamic acids having a mole percent ratio of from 45:5:50 to 25:25:50 PMDA-ODPA-ODA yield polyimides having Tgs over the range of from about 375° C. to about 300° C.

The amount of ODA is set at about 50 percent. As will be appreciated by one skilled in the art, this is set so as to correlate with the amounts of PMDA and ODPA and provide a basis for formation of a stoichiometric polyamic acid.

One unique property of polyamic acid copolymer per the present invention is that the incorporation of even a small amount of ODPA, e.g., as little as about 5 mole percent, into a PMDA-ODA polymer eliminates the characteristic viscosity instability observed in PMDA-ODA solutions.

While in theory the copolymers of the present invention can be block copolymers or a copolymer blend can be used, we have found that a random copolymer is best suited for obtaining the maximum desirable physical properties of the materials involved to provide a homogeneous, stable polymer system tailored specifically for semiconductor manufacture. However, this does not preclude the use of block copolymers or blends in device manufacture.

The polyamic acid copolymers of the present invention are conveniently prepared by adding a uniform total molar ratio of mixed PMDA-ODPA to a solution containing the desired molar equivalent of ODA in a solvent. The solvents are not unduly limited, and a number of solvents or solvent mixtures can be used, e.g., N-methyl pyrrolidone (NMP), dimethyl acetamide (DMAc), dimethyl formamide (DMF), dimethyl sulfoxide (DMSO) or suitable mixtures of these solvents with various conventional hydrocarbon solvents.

The polyamic acid copolymer is typically formed at a temperature of about room temperature over a period of about 12 to about 24 hours at normal ambient pressure. These conditions are not to be construed as limitative and can be freely varied by one skilled in the art, and it is believed that sub- and superatmospheric pressures may also be useful.

The solids content of the polyamic acid copolymer solution which is thus obtained is not overly important, but for ease of application is typically on the order of about 2~3% to about 30 wt. percent solids based on solution weight.

The resulting polyamic acid copolymer solution is then cured using a thermal treatment, a catalytic treatment or the like.

The final copolyimides may also be formed by proceeding through intermediates other than polyamic acids, e.g., polyamide esters, polyamide amides, etc.

For example, thermal curing can be at about 120° to about 160° C. for about 10 to about 30 minutes followed by thermal curing at about 200°–350° C. for about 10 to about 60 minutes. An example of a typical catalytic cure would include dehydration in acetic anhydride-pyridine systems.

The polyamic acid copolymer solution, which is typically an amber viscose material, is thus cured to the desired polyimide illustrating the characteristics heretofore discussed.

Final curing of the polyamic acid copolymer solutions of the present invention fuses and stabilizes a device laminate into a rigid structure with a minimum of interfacial boundaries, relaxing stress and improving quality and reliability in the final product. This phenomenon is consistent with polymer healing above the Tg as discussed in J. Chem. Phys. 75(10), Nov. 15, 1981 pgs. 5194–5198 by Prager et al.

The raw materials used to form the copolymers of the present invention and comparison materials are either commercially available or synthesized in a conventional manner.

Pyromellitic dianhydride, benzophenonetetracarboxylic dianhydride and 4,4'-oxydianiline were purchased from Aldrich Chemical Company, Milwaukee, Wis., and were sublimed twice before use. N-methylpyrrolidone was supplied through Burdick and Jackson, Inc., Muskegon, Mich. 4-Bromo-o-xylene (tech. grade) and 3,4-dimethylphenol were obtained from Aldrich and used as supplied. Solvesso 100 was purchased from C. E. Bradley Labs, Brattleboro, Vt.

Preparation of oxydiphthalic dianhydride

Step (1) preparation of 3,3'4,4'-tetramethyldiphenyl ether 122 g (1.00 mole) of 3,4-dimethylphenol and 57 g (1.01 mole) KOH were added to a 1 liter 3 neck flask fitted with a heating mantle, magnetic stirrer, thermometer and reflux condenser; the mixture was warmed to about 140° C. for 15 minutes, melting the phenol and forming a solution of the potassium salt. The mixture was cooled to 100° C., and 185 g (1.0 mole, 135 ml) of 4 bromo-o-xylene (Aldrich, contains 25% 3-bromo-o-xylene) and 0.5 g of a very fine copper powder were added, and the mixture refluxed for 1.5 hours. The reflux condenser was then replaced with a 40 cm Vigreaux column with a distilling head, and a mixture of water and bromoxylene distilled until the pot temperature reached 220° C. The reaction mixture was cooled, poured into 800 ml of 1M aqueous KOH, filtered, and extracted with two 500 ml portions of $CH_2Cl_2$. The $CH_2Cl_2$ was removed by flash evaporation and the product distilled in two stages. The fraction boiling from 80°–110° C./12 mm was mostly bromoxylene; the ether fraction boiling from 120°–160°/1.5 mm, crystallized on standing (and during distillation) yielding 155 g (68.5%) of the tetramethyldiphenyl ether.

Step (2) preparation of 3,3',4,4'-oxydiphthalic acid 72 g (0.318 moles) of tetramethyldiphenyl ether was placed in a 2 liter reaction kettle fitted with three water condensers, a large magnetic stirrer and a heating mantle; 800 ml of pyridine and 200 ml of water were added and the mixture brought to reflux. 200 g (1.27 moles) of $KMnO_4$ was washed down the condenser with small amounts of water.

After permanganate discoloration, the solution was cooled and the $MnO_2$ vacuum filtered (Buchner funnel). The solvent was flash evaporated (and recycled), bringing the total solution volume to about 250 ml. The residue was dissolved in 1 liter of 5% NaOH, heated to reflux, and oxidized as before using 200 g of $KMnO_4$. When addition was complete, the solution was refluxed 30 minutes, discolored with a few ml of ethanol, cooled, and refiltered. The filtrate was acidified to pH 1 with conc. HCl, cooled, and the precipitated acid collected by filtration, and washed with cold water. This precipitate (approx. 70 g) was suspended in 1 l of hot water, digested at 95° C. for 1 hour, cooled, refiltered, and dried in a desiccator under vacuum yielding 67 g (0.19 moles or 60%) of the acid.

Step (3) preparation of oxydiphthalic dianhydride 133 g of dried acid was suspended in 250 ml of acetic anhydride and the mixture refluxed for four hours. At this point, about 200 ml of the liquid was distilled and the residual solid dried on a rotary evaporator. The dry solid was dissolved in acetone, treated with activated charcoal, filtered, and the acetone flash evaporated. The residual anhydride melted at 226° C. (uncorrected).

Preparation of polymers and copolymers

Polymers and copolymers were prepared as solutions of from 16 to 20% solids (by weight) in either NMP or NMP-Solvesso 100 (80:20 volume). These solutions were prepared by dissolving the appropriate weight of sublimed 4,4'-oxydianiline in the solvent (using either a magnetic stirrer or a roller mill) and then adding a molar equivalent of the appropriate anhydride mixture as the solid. The solution was mixed until solution of anhydride was complete (for about 16 hours).

In this manner, e.g., copolymer E was formulated by dissolving 27.7137 g (0.13840 moles) of oxydianiline in 287 ml of NMP. When solution was complete, 18.1155 g (0.08304 moles) of pyromellitic dianhydride and 17.1707 g (0.055360 moles) of oxydiphthalic dianhydride were added and the suspension mixed at room temperature overnight; the viscosity of this solution remained at 47 stokes +/−2 or 21 days at 25° C. Other polymers and copolymers are prepared in a similar manner.

Having thus generally describing the invention, the following examples are provided to illustrate currently best preferred modes of practicing the invention.

EXAMPLES

A series of polyamic acid polymers and random copolymers was prepared over a broad range of mixed anhydride ratios (hereafter both sometimes are merely referred to as polymer for brevity).

The copolymers were prepared by adding a uniform total molar ratio of mixed PMDA-ODPA anyhydrides to a solution containing the molar equivalent of ODA in NMP.

It is advisable, in formulating the copolymers of the present invention, to keep close to a 1:1 anhydride-amine stoichiometric ratio; otherwise viscosity differences may be observed.

Mixed anhydrides were formulated in 10 percent molar increments of ODPA from 10 percent to 90 percent. The copolymers and polymers were prepared as solutions of 20 percent solids.

Each formulation yielded an amber viscose material which was thermally cured at the later described conditions to yield the desired polyimide. A summary of the copolymer series is presented in the following Table; it should be noted that all mole % values are for total anhydrides; thus, a 10 percent ODPA value corresponds to a copolymer containing 5 mol percent ODPA, 45 mol percent PMDA and 50 mol percent ODA.

TABLE

| POLYMER DESIGNATION | MOLE % PMDA | MOLE % ODPA | $T_g$ after curing to 200° C. |
|---|---|---|---|
| A | 100 | 0 | 390° C. |
| B | 90 | 10 | 375 |
| C | 80 | *20 | 355 |
| D | 70 | *30 | 340 |
| E | 60 | *40 | 320 |
| F | 50 | *50 | 302 |
| G | 40 | 60 | 302 (192β) |
| H | 30 | 70 | 294 (192β) |
| I | 20 | 80 | 267 (192β) |
| J | 10 | 90 | 272 (200β) |
| K | 0 | 100 | 270 (196β) |

THERMOGRAVAMETRIC STABILITY OF THE POLYMERS
% Weight Loss in Nitrogen at 400° C.

| Polymer | to 400° C. | 20 min | 1 Hr | at 450°/ 30 min | at 500°/ 1 hr |
|---|---|---|---|---|---|
| A | 9.9 | | 1.0 | 0.3 | 0.6 |
| B | 9.9 | | 0.8 | 0.3 | 1.0 |
| C | 12.5 | | 0.5 | 0.2 | 0.8 |
| D | 9.2 | | 0.5 | 0.2 | 1.5 |
| E | 9.8 | 1.0 | 1.8 | 0.2 | 1.6 |
| F | 9.2 | 0.4 | 1.3 | 0.2 | 1.9 |
| K | 10.4 | 0.5 | | 0.8 | 6.3 |

TENSILE PROPERTIES OF SOME POLYMER FILMS

| Polymer | Tensile Strength (PSI) | % Elongation at Break |
|---|---|---|
| A | 28 K | 60 |
| C | 25 K | 55 |
| D | 22 K | 57 |
| E | 25 K | 80 |
| F | 14 K | 20 (Thin Film) |
| K | 20 K | 65 |

POLYMER EVALUATION FOR GAP FILLING AND POLARIZATION TEMPERATURE

TABLE-continued

| Polymer | Approx. Polarization Temperature | Blanket Coat Quality |
|---|---|---|
| A | 90° C. | Excellent |
| D | 100° C. | Excellent |
| E | 115° C. | Excellent |
| F | 125° C. | Excellent |

*preferred

In the above Table, copolymers B-J are within the claims herein whereas polymer A and polymer K fall outside the claims.

Each of the above materials were evaluated for their $T_g$ temperature after curing on glass wool at 200° C. for two hours (curing on glass wool is a laboratory technique which permits easy analysis of $T_g$ values). $T_g$ analysis was over the temperature range of 25° C. to 500° C. by dynamic mechanical analysis (DMA).

The results are presented in the above Table and in FIG. 1 attached hereto. Also presented in the above Table are thermogravametric stability values for the copolymers of the invention, tensile properties of some copolymer films per the present invention and copolymer evaluation for gap filling and polarization temperature for some copolymers of the present invention, along with some results for polymers A and K, all of which will be later explained. Samples of the resulting polyimide polymers and copolymers were also temperature cycled from 25° C. to 400° C. while monitoring the stability of the $T_g$; the results from these studies are discussed below.

With respect to Polymer A, when cured to 200° C. this polyimide displayed a $T_g$ at a temperature of 390° C. However, when the sample of Polymer A was cooled to 25° C. and reheated to 400° C., the $T_g$ disappeared, a phenomenom consistent with polymer cross-linking.

The copolymers containing from 10 to 50% ODPA also gave a single $T_g$; however, it was found that $T_g$ was proportional to the amount of ODPA added and that the $T_g$ could be varied over the range of from 390° C. to 302° C., a plot of $T_g$ versus percent composition being linear in this region (see the FIGURE).

The temperature stability of this group of polymers and copolymers, on cycling from 25° C. to 400° C., is also noteworthy since the polymers and copolymers can be classified into three subgroups:

(1) Polymers containing only PMDA or 10 percent ODPA: these materials change on heat cycling as above and lose the $T_g$ which they initially display (375° to 390° C.). This shift occurs at high temperatures.

(2) Polymers containing 20 to 30 mole percent ODPA, when heat cycled as above, retain the $T_g$ they initially display.

(3) Polymers containing 40 to 50 mole percent ODPA undergo a progressive upward shifting of $T_g$ upon heat cycling as above. Five cycles of 25° C. to 400° C. can shift the $T_g$ up to 30° C. higher than that initially observed.

Above the 50 percent ODPA level, the linearity of $T_g$ with the percent of ODPA changes. Polymers containing 60 to 70 percent ODPA gave two transitions, one at about 190° C. (β transition) and one between 302° C. and 294° C. When heat cycled as above, both transitions disappear, implying a dramatic reordering takes place in the polymer network.

Polymers containing 80 to 100 percent ODPA also gave two transitions, one at about 200° C. and one at 270° C., and when reheated the lower transition disappears and the 270° C. Tg is amplified.

The data thus clearly establish that a range of Tg stability exists at the proportions claimed herein and that this range corresponds to a useful range for semiconductor processing.

Polymers C through F which contain 20 to 50 percent ODPA with a Tg in the range of about 300 to about 350° C. are most preferred in accordance with the present invention since their Tg improves miscibility and contact intimacy.

BTDA-PMDA-ODA (see U.S. Pat. No. 3,264,250 Gall) copolymers also gave a linear variation of Tg with percent anhydride composition. The slope of the curve shown in the FIGURE is noticeably shallower than with the ODPA copolymers and while ODPA copolymers become non-linear at higher OPDA concentration ranges, BTDA copolymers showed deviations in Tg at lower BTDA concentrations.

Solution viscosity studies were made concerning the viscosity stability of solutions of polyamic acid polymers and copolymers, revealing a dramatic difference between Polymer A and Polymers containing ODPA. Solutions of Polymer A were found to decrease in viscosity over a period of time to a minimum value and then to rise. This obviously creates manufacturing problems since a drop in viscosity changes the application parameters controlling uniform coating.

Specifically, solutions were formed from Polymer A, Polymer C, Polymer D, Polymer E and Polymer F and these solutions were monitored for up to 104 days using the Cannon Fenske Viscosity method. While Polymer A showed a viscosity drop at 25° C. of over 50% in two weeks, Polymers C, D, E and F underwent a rapid decrease in viscosity followed by an extended period (2-4 weeks) of viscosity stability. The length of the viscosity stability period varied with the viscosity itself in that solutions of lower viscosities had longer periods of stability. This difference is not the result of preferential imidization in the system.

Thermogravametric analysis (TGA) established that polymers B through F displayed thermal properties similar to Polymer A, thus retaining and exhibiting the excellent thermal stability of Polymer A essential in semiconductor device manufacture.

The copolymers of the present invention are good semiconductor dielectrics and possess good thermal stability. Thermogravametric analysis (TGA) was performed on various copolymers and the data are presented in the Table earlier set forth. Samples of polyamic acid solutions were cured to 200° C. and the samples held in nitrogen at various temperatures for given time increments. Decomposition was reported as percent weight loss and compared to a commercial polymer similar to Polymer A. The data indicate that copolymers containing up to 50% ODPA show little if any difference from the commercial polymer corresponding to Polymer A at temperatures up to 450° C. At 500° C. a slight increase in decomposition (1-2%) was noted in the polymers containing larger amounts of ODPA (60-90%), and Polymer K showed significant decomposition after 1 hour. At 600° C. substantial decomposition occurred in all systems. The data indicate that thermal effects are not observed below 450° C., and thus the copolymers of the present invention are highly stable at processing temperatures as are conventionally used in the art.

Certain of the copolymers of the present invention were also subjected to blanket coat quality testing and electrical polarization testing, the results being set forth in the earlier presented Table.

The blanket coverage of the three copolymers tested was as good as or better than a commercial polymer corresponding to Polymer A.

The electrical polarization temperature of all copolymers tested was significantly better (higher) than the commercial polymer corresponding to Polymer A. The approximate polarization temperature given in the earlier presented Table refers to the approximate temperature at which significant distortion of an equilibrium I/V loop of +/−5 volts occurred. The higher the temperature, the "better" the material is for relative polarization.

Certain of the copolymers of the present invention were also subjected to tensile strength and elongation at break testing in a conventional manner and the data generated are also presented in the earlier given Table. The data indicate that the copolymers of the present invention are quite similar to a commercially available polymer corresponding to Polymer A.

While there have been described what are at present considered to be the preferred embodiments of this invention, it will be obvious to those skilled in the art that various changes and modifications may be made therein without departing from the invention, and it is, therefore, intended to cover all such changes and modifications as fall within the true spirit and scope of the invention.

We claim:

1. A copolymeric polyamic acid which is capable of forming a polyimide consisting essentially of, in mole percent, from greater than 5 percent to about 45 percent pyromellitic dianhydride, from about 5 percent to about 45 percent oxydiphthalic dianhydride, and about 50 percent of oxydianiline which copolymeric polyamic acid per se exhibits stable solution viscosity, which copolymeric polyamic acid contains 10 to 90 percent recurring units of formula A as set forth below and 90 to 10 percent recurring unites of formula B as set forth below:

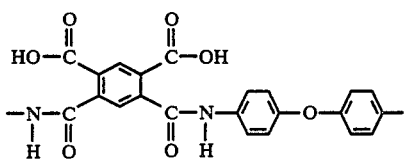

A

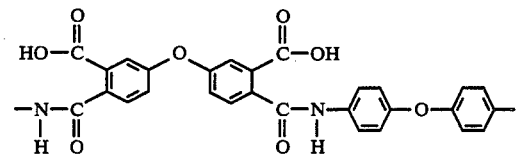

B

2. A polyimide formed by curing the copolymer of claim 1, which polyimide has a high electrical polarization temperature, provides interface free polyimide/polyimide laminates having high adhesion and exhibits good mechanical properties with high elongation at break.

3. The copolymeric polyamic acid of claim 1 consisting essentially of, in mole percent, from 25 to 45 percent pyromellitic dianhydride, from 10 to 25 percent oxydiphthalic dianhydride and about 50 percent of oxydianiline.

4. A polyimide formed by curing the copolymer of claim 3, which polyimide has a high electrical polarization temperature, provides interface free polyimide/polyimde laminates having high adhesion and exhibits good mechanical properties with high elongation at break.

5. The copolymeric polyamic acid of claim 1 consisting of the recited components.

6. The copolymeric polyamic acid of claim 3 consisting of the recited components.

7. A polyimide formed by curing the copolymer of claim 5, which polyimide has a high electrical polarization temperature, provides interface free polyimide/polyimide laminates having high adhesion and exhibits good mechanical properties with high elongation at break.

8. A polyimide formed by curing the copolymer of claim 6, which polyimide has a high electrical polarization temperature, provides interface free polyimide/polyimide laminates having high adhesion and exhibits good mechanical properties with high elongation at break.

9. The copolymeric polyamic acid of claim 1, formed by adding a uniform total molar ratio of mixed pyromellitic dianhydride-oxydiphthalic dianhydride to a solution containing the desired molar equivalent of oxydianiline in a solvent and thereafter maintaining the same at a temperature of about room temperature over a period of about 12 to about 24 hours, thereby obtaining said copolymeric polyamic acid which exhibits stable solution viscosity at a solids content of about 2~3% to about 30 wt% solids based on solution weight.

10. The copolymeric polyamic acid of claim 1, which exhibits a reproducibly adjustable Tg in the range of 375° C.–270° C. and which exhibits excellent adhesion.

* * * * *